(12) United States Patent
Kim

(10) Patent No.: US 7,317,328 B2
(45) Date of Patent: Jan. 8, 2008

(54) TEST DEVICE FOR ON DIE TERMINATION

(75) Inventor: Kyung-Hoon Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 68 days.

(21) Appl. No.: 11/322,283

(22) Filed: Dec. 29, 2005

(65) Prior Publication Data

US 2007/0126467 A1 Jun. 7, 2007

(30) Foreign Application Priority Data

Sep. 29, 2005 (KR) ............... 10-2005-0091519

(51) Int. Cl.
*H03K 17/16* (2006.01)
(52) U.S. Cl. .................... 326/30; 326/87; 326/83
(58) Field of Classification Search ................ 326/26, 326/27, 30, 82–87
See application file for complete search history.

(56) References Cited

U.S. PATENT DOCUMENTS

| 6,847,225 | B2 * | 1/2005 | Viehmann et al. ............. 326/30 |
| 6,885,959 | B2 * | 4/2005 | Salmon et al. ............... 702/107 |
| 6,924,660 | B2 | 8/2005 | Nguyen et al. |
| 7,124,325 | B2 * | 10/2006 | Hartmann et al. ............. 714/30 |
| 7,161,865 | B2 * | 1/2007 | Fujisawa ..................... 365/226 |
| 7,193,431 | B2 * | 3/2007 | Miyake et al. ................ 326/30 |
| 7,194,559 | B2 * | 3/2007 | Salmon et al. ................. 710/8 |
| 2004/0218434 | A1 | 11/2004 | Hwang et al. |
| 2005/0180229 | A1 | 8/2005 | Jin |
| 2005/0226080 | A1 | 10/2005 | Lee |

FOREIGN PATENT DOCUMENTS

| JP | 2004310981 | 11/2004 |
| KR | 1020040021110 A | 3/2004 |
| KR | 1020050012931 A | 2/2005 |
| KR | 1020050101865 A | 10/2005 |

* cited by examiner

*Primary Examiner*—Don Le
(74) *Attorney, Agent, or Firm*—Blakely, Sokoloff, Taylor & Zafman

(57) ABSTRACT

An on die termination (ODT) test device includes: a control unit for selectively activating a plurality of pull-up signals and a plurality of pull-down signals by performing a logic operation to an ODT control signal for controlling a resistor of a termination terminal, an off chip driver (OCD) control signal for adjusting an impedance of an output terminal, a plurality of ODT test signals for measuring a termination resistance of the termination terminal and a plurality of ODT signals having a different resistance; and a pull-up/pull-down unit for selectively driving a plurality of pull-up drivers and a plurality of pull-down drivers according to the pull-up signals and the pull-down signals in order to output a corresponding resistance of the output terminal at a read operation mode.

10 Claims, 5 Drawing Sheets

FIG. 4

| ODTon | OCDon | TM_ODT1 | TM_ODT2 | ODT1 | ODT2 | PU0 | PU1 | PU2 | PU3 | PU4 | PU5 | PD0 | PD1 | PD2 | PD3 | PD4 | PD5 |
|---|---|---|---|---|---|---|---|---|---|---|---|---|---|---|---|---|---|
| 1 | 0 | x | x | 1 | 0 | 1 | 1 | 0 | 0 | 0 | 0 | 1 | 1 | 0 | 0 | 0 | 0 |
| 1 | 0 | x | x | 0 | 1 | 1 | 0 | 0 | 0 | 0 | 0 | 1 | 0 | 0 | 0 | 0 | 0 |
| 0 | 1 | 0 | 0 | x | x | 1 | 1 | 1 | 1 | 1 | 1 | 1 | 1 | 1 | 1 | 1 | 1 |
| 0 | 1 | 1 | 0 | x | x | 1 | 1 | 0 | 0 | 0 | 0 | 1 | 1 | 0 | 0 | 0 | 0 |
| 0 | 1 | 0 | 1 | x | x | 1 | 0 | 0 | 0 | 0 | 0 | 1 | 0 | 0 | 0 | 0 | 0 | ns
TEST DEVICE FOR ON DIE TERMINATION

FIELD OF INVENTION

The present invention relates to a device for testing an on die termination (ODT); and, more particularly, to a test device for testing a termination resistor (Ron) by converting an ODT driver to an off chip driver.

DESCRIPTION OF PRIOR ART

Recently, various new technologies have been developed for improving a data transferring speed of a double data rate (DDR) memory device. For instance, an off chip driver calibration (OCD Calibration) technology has been introduced to a specification of a DDR2 synchronous semiconductor memory device by the JEDEC (Joint Electron Engineering Council) in order to adjust an impedance of a data output unit of a semiconductor memory device.

That is, the optimum impedance of a data output driver for a current system is detected by measuring a voltage or a current which is flown from an external circuit such as a chip set to the data output driver so that an impedance of the data output driver is adjusted to the optimum impedance. For this, a DDR2 synchronous semiconductor memory device additionally includes an OCD control unit for adjusting an impedance of the data output driver.

Meanwhile, a resistor of a termination terminal is needed for stably transferring a signal between circuits. That is, if a resistor is not appropriately matched, an error of a signal reflection occurs, i.e., a transferred signal can be reflected back. However, in case of providing an external fixed resistor, an appropriate matching may not be gained due to aging of an integrated circuit, temperature variations or manufacturing process variations.

Therefore, a technology for adjusting a termination resistance has been developed in order to get the same resistance with an external reference resistor by controlling the number of turned-on transistors among a plurality of transistors connected in parallel.

FIG. 1a is a block diagram showing a conventional ODT device.

As shown, a termination resistance is controlled by selectively connecting a termination resistor (RTT) to a power supply voltage VDDQ or a ground voltage VSSQ by using a plurality of switches SW1 and SW2.

FIG. 2 is a block diagram showing a conventional OCD/ODT device.

As shown, the conventional OCD/ODT device includes a control unit 10 and a pull-up/pull-down unit 20.

The control unit 10 includes a first to a third NAND gates ND1 to ND3 and an inverter IV1.

The first NAND gate ND1 performs a logic NAND operation to an inverted signal of an ODT control signal ODTon and an OCD control signal OCDon. The second NAND gate ND2 performs a logic NAND operation to the ODT control signal ODTon, an inverted signal of the OCD control signal OCDon and an ODT signal ODT1. The third NAND gate ND3 performs a logic NAND operation to outputs of the first and the second NAND gates ND1 and ND2 to thereby generate a pull-up signal PU1 and a pull-down signal PD1. The inverter IV1 inverts an output of the second NAND gate ND2 to thereby generate pull-up signals PU2 to PU5 and pull-down signals PD2 to PD5.

The pull-up/pull-down unit 20 includes a plurality of pull-up units 21 to 26 and a plurality of pull-down units 27 to 32 for receiving a data D and an enable clock EN which is same to a delay locked loop (DLL) clock. The pull-up units 21 to 26 respectively receive pull-up signals PU0 to PU5. Similarly, the pull-down units 27 to 32 respectively receive pull-down signals PD0 to PD5. Herein, the pull-up signal PU0 and the pull-down signal PD0 have a voltage level of the power supply voltage VDDQ. It is preferred that a PMOS/NMOS resistance of the pull-up/pull-down unit 20 is 240 ohm.

For instance, in case of a DDR3 semiconductor memory device, a 40 ohm-driver is used as the OCD and a 60 ohm or a 120 ohm driver is used as the ODT. Accordingly, for using both of the OCD and the ODT, six pull-up drivers each having 240 ohm and six pull-down drivers each having 240 ohm are used.

That is, to be used as the OCD, all of the six 240 ohm-drivers are used. For the 60 ohm-ODT, two of the six pull-up drivers connected in parallel are activated having 120 ohm and two of the six pull-down drivers connected in parallel are activated having 120 ohm. As a result, by a parallel connection of the two 120 ohms, a 60 ohm is generated. Similarly, for the 120 ohm-ODT, each one of the six pull-up drivers and the six pull-down drivers are turned-on to thereby form the ODT having 120 ohm-driver.

Therefore, according to the number of turned-on 240 ohm-drivers, the OCD/ODT is operated. By using the above-mentioned method, ODT signals ODT1 and ODT2 having a 60/120/240 ohm-driver can be selectively used.

Accordingly, when the OCD control signal OCDon is inputted to the control unit 10, all the pull-up signals PU0 to PU5 are activated and, thus, all the six pull-up drivers 21 to 26 are operated. When the ODT control signal ODTon is inputted to the control unit 10, 4 or 2 drivers are turned on to have a 60 ohm or 120 ohm-driver determined by an extended mode register set (EMRS)

Likewise, the same operation is performed for forming a 60/120/240 ohm driver. That is, if the OCD control signal OCDon is inputted, a 60/120 ohm driver is turned on. If the ODT control signal ODTon is inputted, a 120 ohm or 240 ohm driver is turned on according to a 60/120 ohm-ODT operation determined by the EMRS.

However, the above-mentioned ODT device cannot accurately measure a termination resistance (Ron) of the ODT. That is, since a PMOS transistor of the pull-up units 21 to 26 and an NMOS transistor of the pull-down units 27 to 32 are simultaneously turned-on/off, each termination resistance of the PMOS and the NMOS transistors cannot be independently measured.

In case of the conventional ODT device, each termination resistor (Ron) of the pull-up units and the pull-down units is operated in the alternating current (AC) basis and, thus, both a power supply voltage VDD and a ground VSS, which should be analyzed in the direct current (DC) basis, are interpreted as an AC ground. Accordingly, in case of a 50 ohm-ODT, all the pull-up/pull-down units are connected to a 100 ohm-resistor.

Therefore, in case of the conventional ODT where the PMOS and the NMOS transistors are simultaneously turned-on/off, the termination resistance (Ron) is measured by changing a voltage level of an output voltage from the power supply voltage VDD to the ground voltage VSS. However, in this case, a linearity characteristics of the termination resistance (Ron) cannot be independently measured at the PMOS and the NMOS transistors due to a characteristics of a MOS transistor affected by a drain source voltage VDS. Therefore, currents are offset each other as shown in FIG. 1c in comparison with the ideal case shown in FIG. 1b.

SUMMARY OF INVENTION

It is, therefore, an object of the present invention to provide an on die termination (ODT) test device for testing a termination resistor (Ron) by converting an ODT driver to an off chip driver (OCD) in order to improve a linearity of the termination resistor.

In accordance with an aspect of the present invention, there is provided an on die termination (ODT) test device including: a control unit for selectively activating a plurality of pull-up signals and a plurality of pull-down signals by performing a logic operation to an ODT control signal for controlling a resistor of a termination terminal, an off chip driver (OCD) control signal for adjusting an impedance of an output terminal, a plurality of ODT test signals for measuring a termination resistance of the termination terminal and a plurality of ODT signals having a different resistance; and a pull-up/pull-down unit for selectively driving a plurality of pull-up drivers and a plurality of pull-down drivers according to the pull-up signals and the pull-down signals in order to output a corresponding resistance of the output terminal at a read operation mode.

BRIEF DESCRIPTION OF THE DRAWINGS

The above and other objects and features of the present invention will become apparent from the following description of preferred embodiments taken in conjunction with the accompanying drawings, in which:

FIGS. 1b and 1c are wave diagrams showing problems of the conventional ODT device shown in FIG. 1a;

FIG. 4 is a truth table showing an operation of the ODT test device shown in FIG. 3.

DETAILED DESCRIPTION OF INVENTION

Hereinafter, an on die termination (ODT) test device in accordance with the present invention will be described in detail referring to the accompanying drawings.

Figure 1A:
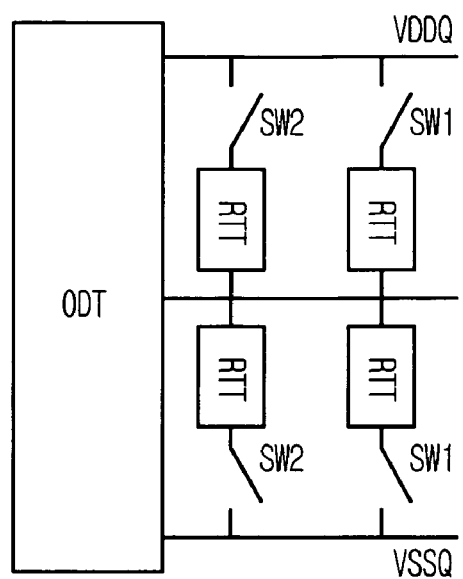
FIG. 1a is a block diagram showing a conventional ODT device.
Figure 1B:
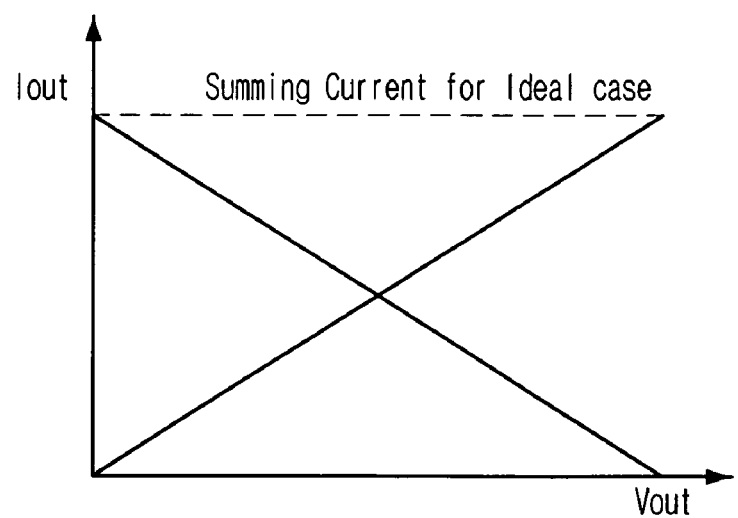
Figure 1C:
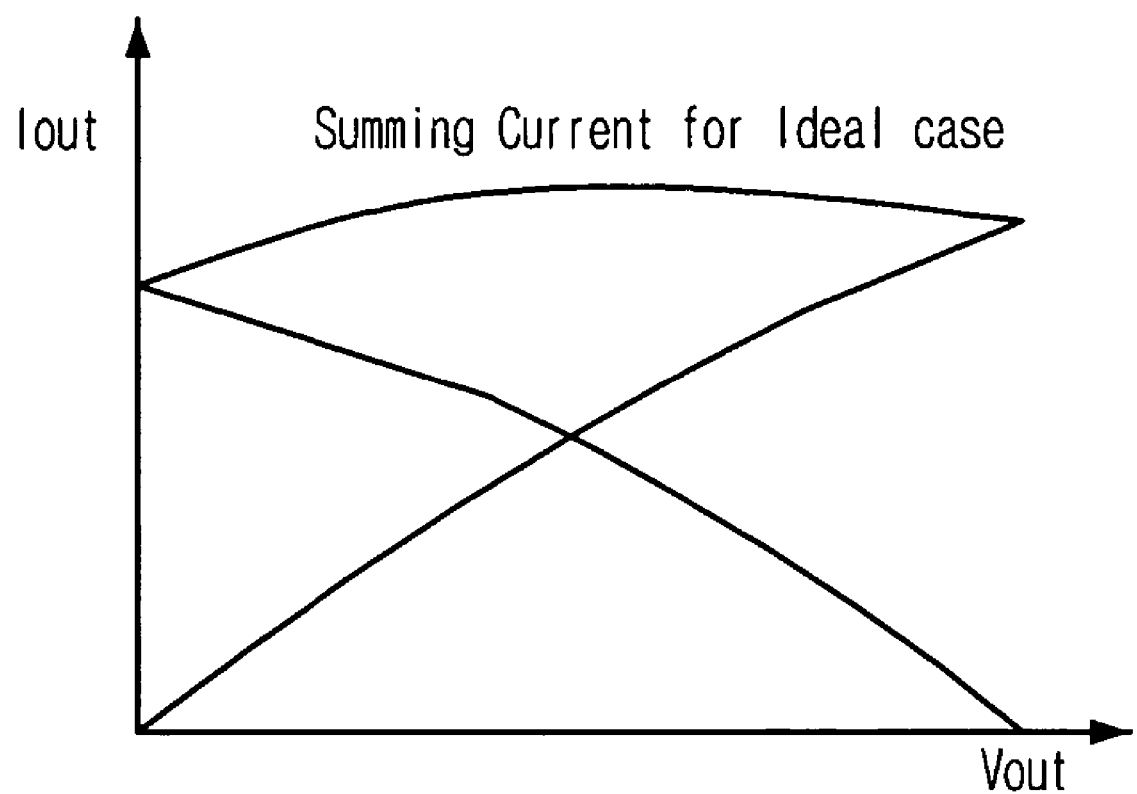
Figure 2:
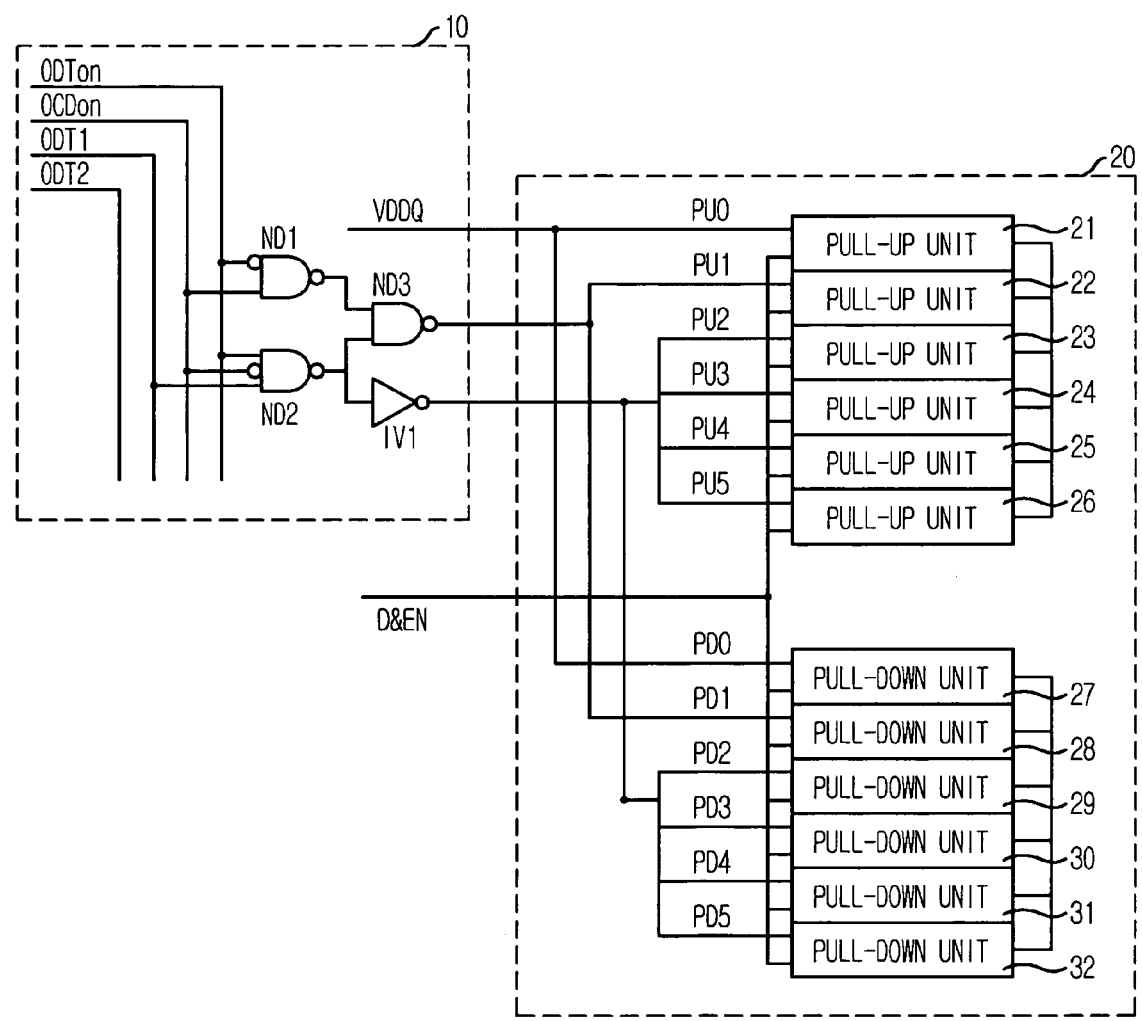
FIG. 2 is a block diagram showing a conventional OCD/ODT device.
Figure 3:
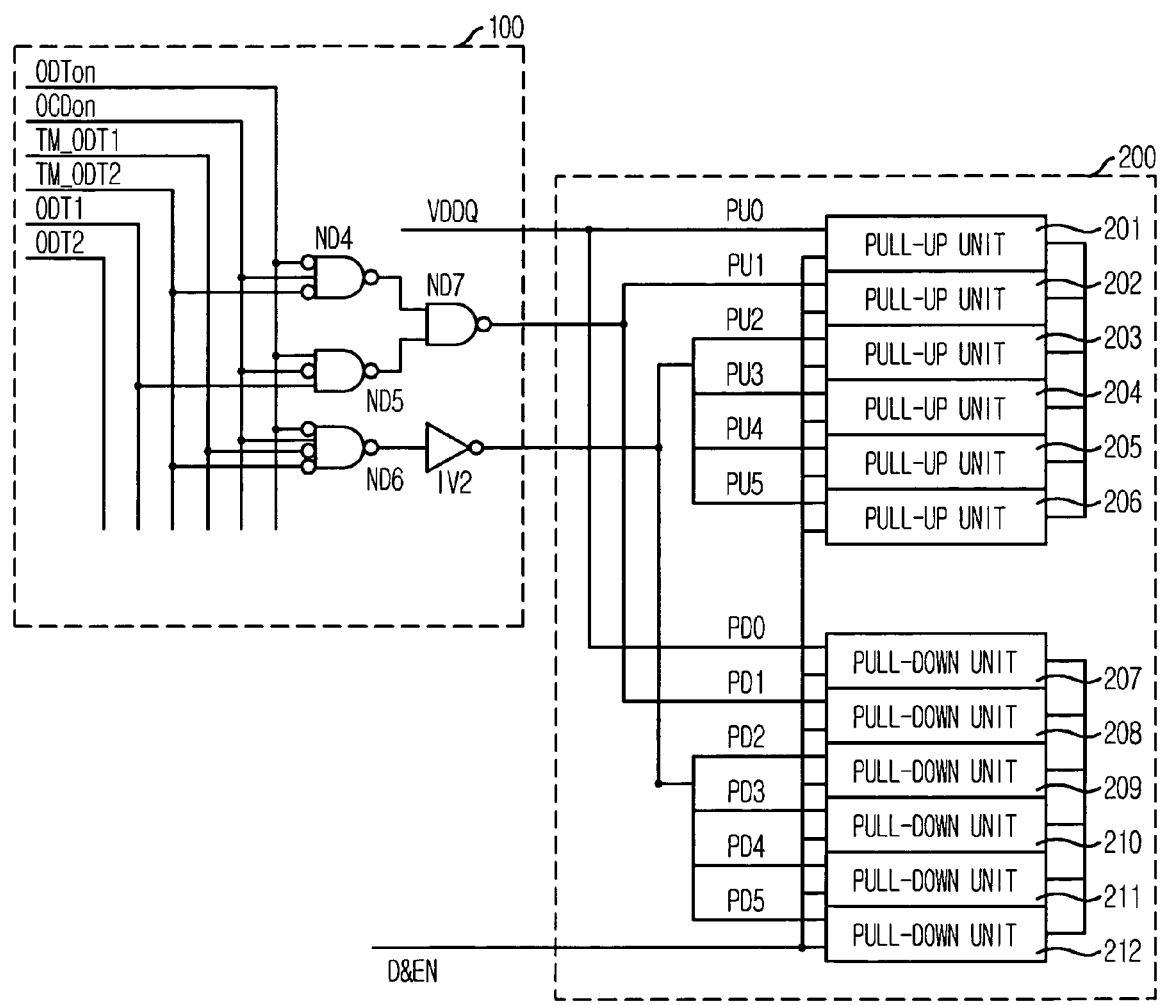
FIG. 3 is a block diagram showing an ODT test device in accordance with a preferred embodiment of the present invention.

FIG. 3 is a block diagram showing an ODT test device in accordance with a preferred embodiment of the present invention.

As shown, the ODT test device includes a control unit 100 and a pull-up/pull-down unit 200.

The control unit 100 includes a first to a fourth NAND gates ND4 to ND7 and an inverter IV2.

The first NAND gate ND4 performs a logic NAND operation to an inverted signal of an ODT control signal ODTon, an OCD control signal OCDon and an inverted signal of an ODT test signal TM_ODT2. The second NAND gate ND5 performs a logic NAND operation to the ODT control signal ODTon, an inverted signal of the OCD control signal OCDon and an ODT signal ODT1. The third NAND gate ND6 performs a logic NAND operation to the inverted signal of the ODT control signal ODTon, the OCD control signal OCDon, an inverted signal of an ODT test signal TM_ODT1 and the inverted signal of the ODT test signal TM_ODT2.

The fourth NAND gate ND7 performs a logic operation to outputs of the first and the second NAND gates ND4 and ND5 to thereby generate a pull-up signal PU1 and a pull-down signal PD1. The inverter IV1 inverts an output of the third NAND gate ND6 in order to generate pull-up signals PU2 to PU5 and pull-down signals PD2 to PD5.

The pull-up/pull-down unit 200 includes a plurality of pull-up units 201 to 206 and a plurality of pull-down units 207 to 212 for receiving a data D and an enable clock EN such as a delay locked loop (DLL) clock. The pull-up units 201 to 206 respectively receive pull-up signals PU0 to PU5. Similarly, the pull-down units 207 to 212 respectively receive pull-down signals PD0 to PD5. Herein, the pull-up signal PU0 and the pull-down signal PD0 have a voltage level of a power supply voltage VDDQ. It is preferred that a PMOS/NMOS resistance of the pull-up/pull-down unit 200 is 240 ohm.

In accordance with the present invention, a pull-up ODT and a pull-down ODT are independently operated so that a termination resistance (Ron) can be independently measured.

A structure of the ODT device in accordance with the present invention can be configured according to a type of a semiconductor memory device, i.e., DDR2 and DDR3 semiconductor memory devices. In case of the ODT device for the DDR2, each linearity specification of termination resistances (Ron) of the ODT and the OCD is differently configured and each circuit is independently provided. In case of the ODT device for the DDR3, each linearity specification of termination resistances (Ron) of the ODT and the OCD is important and is similarly configured. In this case, the ODT is used for a write operation and the OCD is used for a read operation; and, since the write and the read operations are not performed at the same time, a circuit having a superior linearity can be shared.

Accordingly, in the present invention, it is assumed that the termination resistances (Ron) of the ODT and the OCD are similarly configured. However, the present invention is not limited to the above-mentioned case and, thus, the present invention can be same applied to the case of the DDR2 for measuring the termination resistance (Ron) of the ODT device.

That is, the termination resistance (Ron) is measured based on an output current generated by sweeping an output voltage from the power supply voltage VDDQ to a ground voltage VSSQ, wherein the power supply voltage VDDQ is supplied to a gate source voltage VGS. This method is the same for the OCD.

Therefore, when a DRAM is set to constantly output a high-data from a DRAM cell, the pull-up units 201 to 206 of the OCD are constantly open. At this state, an output data DQ measures a current by supplying from the power supply voltage VDDQ to the ground voltage VSSQ. On the contrary, an output current of the pull-down units 207 to 212 can be measured by setting the DRAM for constantly outputting a low-data from the DRAM cell. Accordingly, by applying a method of measuring the termination resistance (Ron) of the OCD, the termination resistance (Ron) of the ODT can be measured.

That is, in accordance with the present invention, the ODT is configured to be operated at the read operation not at the write operation by using a predetermined test mode or a mode register set (MRS). At this time, the OCD should not be operated at the read operation. In this manner, the termination resistance (Ron) of the ODT can be measured by using the same method with the OCD.

An operation of the preferred embodiment of the present invention is described below.

The ODT test signals TM_ODT1 and TM_ODT2 are inputted to the control unit 100 for measuring the termination resistance (Ron) of the ODT. Therefore, when the OCD control signal OCDon is inputted according to the ODT test signals TM_ODT1 and TM_ODT2, one or two 240 ohm-drivers are turned on.

A truth table for showing the operation of the ODT test device is shown in FIG. 4.

For instance, when the ODT control signal ODTon is "1" and the OCD control signal OCDon is "0", the ODT test signals TM_ODT1 and TM_ODT2 are not inputted. At this time, when the ODT signal ODT1 is "1" and the ODT signal ODT2 is "0", the pull-up signals PU0 and PU1 and the pull-down signals PD0 and PD1 are "1" so that only two pull-up units 201 and 202 and two pull-down units 207 and 208 are turned-on, wherein each pull-up/pull-down unit is a 240 ohm-driver. Accordingly, the termination resistance of the ODT device can be measured.

Herein, the ODT test signals TM_ODT1 and TM_ODT2 can be activated by using a test mode or a particular command signal inputted from the outside. Also, the ODT test signals TM_ODT1 and TM_ODT2 can be generated by assigning a code signal to the MRS, by using a fuse or by using a voltage forcing provided at a wafer state.

As a result, in accordance with the present invention, by measuring a pull-up/pull-down termination resistance of the ODT, data for correcting each linearity of the pull-up/pull-down termination resistance can be easily collected.

The present application contains subject matter related to Korean patent application No. 2005-91519, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An on die termination (ODT) test device, comprising:
    a control unit for selectively activating a plurality of pull-up signals and a plurality of pull-down signals by performing a logic operation on an ODT control signal for controlling a resistor of a termination terminal, an off chip driver (OCD) control signal for adjusting an impedance of an output terminal, a plurality of ODT test signals for measuring a termination resistance of the termination terminal and a plurality of ODT signals; and
    a pull-up/pull-down unit for selectively driving a plurality of pull-up drivers and a plurality of pull-down drivers according to the pull-up signals and the pull-down signals in order to output a corresponding resistance of the output terminal at a read operation mode.

2. The ODT test device as recited in claim 1, wherein the plurality of ODT test signals are selectively activated according to a test mode.

3. The ODT test device as recited in claim 1, wherein the plurality of ODT test signals are generated by a combination of a particular command signal which is externally inputted.

4. The ODT test device as recited in claim 1, wherein the plurality of ODT test signals are generated by assigning a code signal of a register set including a mode register set (MRS).

5. The ODT test device as recited in claim 1, wherein the plurality of ODT test signals are generated by a voltage forcing at a wafer level.

6. The ODT test device as recited in claim 1, wherein the plurality of ODT test signals are generated by cutting a fuse.

7. The ODT test device as recited in claim 1, wherein the ODT control signal and the OCD control signal are complementarily activated.

8. The ODT test device as recited in claim 1, wherein the plurality of ODT signals are selectively activated when the ODT control signal is activated and the plurality of ODT test signals are selectively activated when the OCD control signal is activated.

9. The ODT test device as recited in claim 1, wherein the control unit selectively activates the plurality of pull-up signals and the plurality of pull-down signals according to a combination of the plurality of ODT test signals when the OCD control signal is activated.

10. The ODT test device as recited in claim 1, wherein the control unit includes:
    a first NAND gate for performing a logic NAND operation to an inverted signal of the ODT control signal, the OCD control signal and an inverted signal of a first ODT test signal;
    a second NAND gate for performing a logic NAND operation to the ODT control signal, an inverted signal of the OCD control signal and a first ODT signal;
    a third NAND gate for performing a logic NAND operation to outputs of the first and the second NAND gates to thereby generate a first pull-up signal and a first pull-down signal;
    a fourth NAND gate for performing a logic NAND operation to the inverted signal of the ODT control signal, the OCD control signal, the inverted signal of the first ODT test signal and an inverted signal of a second ODT test signal; and
    an inverter for inverting an output of the fourth NAND gate to thereby generate the plurality of pull-up signals and the plurality of pull-down signals except for the first pull-up signal and the first pull-down signal.

* * * * *